(12) United States Patent
Ahn et al.

(10) Patent No.: US 10,038,427 B2
(45) Date of Patent: Jul. 31, 2018

(54) POWER PATH SWITCHING IN AN ELECTRONIC DEVICE INCLUDING A PLURALITY OF CHARGING PORTS

(71) Applicant: QUALCOMM Incorporated, San Diego, CA (US)

(72) Inventors: Jongshick Ahn, San Diego, CA (US); Eric B Zeisel, San Diego, CA (US); Cheong Kun, San Diego, CA (US); Jennifer A Hagstrom, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1366 days.

(21) Appl. No.: 13/654,322

(22) Filed: Oct. 17, 2012

(65) Prior Publication Data
US 2014/0103862 A1 Apr. 17, 2014

(51) Int. Cl.
*H02J 7/00* (2006.01)
*H03K 3/0233* (2006.01)

(52) U.S. Cl.
CPC ...... *H03K 3/02335* (2013.01); *Y10T 307/858* (2015.04)

(58) Field of Classification Search
USPC .................................. 320/107, 137–138, 134
See application file for complete search history.

(56) References Cited

U.S. PATENT DOCUMENTS

| 5,610,495 | A | * | 3/1997 | Yee et al. ..................... 320/116 |
| 5,620,495 | A | | 4/1997 | Aspell et al. |
| 7,893,560 | B2 | | 2/2011 | Carter |
| 8,004,247 | B1 | | 8/2011 | Zhang |
| 8,044,639 | B2 | | 10/2011 | Tamegai et al. |
| 2005/0253560 | A1 | | 11/2005 | Popescu-Stanesti et al. |
| 2006/0022640 | A1 | | 2/2006 | Frith et al. |
| 2006/0176038 | A1 | * | 8/2006 | Flatness et al. ............... 323/282 |
| 2009/0102427 | A1 | * | 4/2009 | Tamegai et al. ............... 320/138 |
| 2009/0212635 | A1 | * | 8/2009 | Paradissis ............... H02J 9/061 307/80 |
| 2009/0289605 | A1 | * | 11/2009 | Takahashi et al. ........... 320/163 |
| 2010/0148727 | A1 | | 6/2010 | Kwong et al. |

(Continued)

FOREIGN PATENT DOCUMENTS

| CN | 1741345 A | 3/2006 |
| CN | 101119020 A | 2/2008 |

(Continued)

OTHER PUBLICATIONS

International Search Report and Written Opinion—PCT/US2013/065543—ISA/EPO—dated Mar. 7, 2014.

*Primary Examiner* — Samuel Berhanu
(74) *Attorney, Agent, or Firm* — W&T/Qualcomm

(57) ABSTRACT

Exemplary embodiments are directed to power path switching between multiple charging ports of an electronic device. A device may include a charging port of a plurality of charging ports for coupling to a power supply via an over-voltage protection circuit. The device may further including a comparison unit configured to couple the charging port to the power supply based at least partially on a comparison between a voltage at an input of the over-voltage protection circuit coupled to the charging port with a voltage at the output of the over-voltage protection circuit coupled to the power supply.

25 Claims, 6 Drawing Sheets

(56) References Cited

U.S. PATENT DOCUMENTS

2010/0231171 A1 9/2010 De
2011/0234172 A1 9/2011 Kung
2012/0112686 A1 5/2012 Zhang et al.

FOREIGN PATENT DOCUMENTS

JP S5911740 A 1/1984
JP 2009106058 A 5/2009

* cited by examiner

POWER PATH SWITCHING IN AN ELECTRONIC DEVICE INCLUDING A PLURALITY OF CHARGING PORTS

BACKGROUND

Field

The present invention relates generally to a charging device. More specifically, the present invention relates to systems, devices, and methods for an electronic device having a plurality of charging ports.

Background

Electronic devices, such as mobile telephones, may include a plurality of charging ports. As an example, an electronic device may include a direct current (DC) charging port configured for coupling to a DC power source and a Universal Serial Bus (USB) charging port configured for coupling to a USB power source. In conventional devices, each charging port may be connected to a dedicated over-voltage protection (OVP) circuit, which may comprise a switch. Further, each OVP circuit may be coupled to a switched-mode power supply (SMPS). FIG. 1 illustrates a conventional charging system 100 including a plurality of charging ports (i.e., a first charging port 102, which is a DC charging port, and a second charging port 104, which is a USB charging port). As illustrated, first charging port 102 is coupled to a switch mode power supply (SMPS) 106 via a first OVP circuit 108 and second charging port 104 is coupled to SMPS 106 via a second OVP circuit 110.

As will be appreciated by a person having ordinary skill in the art, when two power sources are simultaneously coupled to an electronic device, only one OVP circuit is allowed to turn on (i.e., conduct). In addition, it normally takes a short amount of time (e.g., a few tenths of millisecond) until a "turn on" sequence for an OVP circuit to be completed because of a debounce timer (i.e., a time allowed to filter out voltage ripple on a charging port during initial turn on due to inrush current and cable inductance). In addition, different charging ports (e.g., DC and USB charging ports) can have different voltage levels. Thus, to prevent charging port damage, an output of a first OVP circuit (e.g., first OVP circuit 108) should be discharged below a voltage level associated with a second OVP circuit (e.g., second OVP circuit 110) before the second OVP circuit can be turned on. This may result in slow power path switching, which may cause a device (e.g., a mobile telephone) to crash if the device is in use while an associated battery is low.

A need exists for methods, systems, and devices for reducing a duration of power path switching of an electronic device including a plurality of charging ports.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Exemplary embodiments, as described herein, are directed to devices, systems, and methods for power path switching. According to one exemplary embodiment, a charging device may include a charging port of a plurality of charging ports coupled to a power supply via an over-voltage protection circuit. The charging device may also include a comparison unit configured to couple the charging port to the power supply based at least partially on a comparison between a voltage at an input of the over-voltage protection circuit, which is coupled to the charging port, with a voltage at the output of the over-voltage protection circuit coupled to the power supply.

According to another exemplary embodiment, a charging device may include a first charging port coupled to an input of a first over-voltage protection circuit. The charging device may further include a second charging port coupled to an input of a second over-voltage protection circuit. In addition, the charging device may include a comparison unit configured to select one of the first charging port and the second charging port for charging. The comparison unit may also be configured comparison to selectively couple the selected charging port to a power supply based at least partially on a comparison between a voltage at the selected charging port and a voltage at an input of the power supply.

Yet another exemplary embodiment comprise a method including comparing a first voltage at a charging port with a voltage at an input of a power supply. The method may also include coupling the charging port to the input of the power supply upon the first voltage being less than or equal to the second voltage. Another method, in accordance with an exemplary embodiment, may include receiving a voltage at a charging port of a plurality of charging ports and selectively coupling the charging port to a power supply if the voltage is greater than or equal to a threshold voltage.

Figure 1:
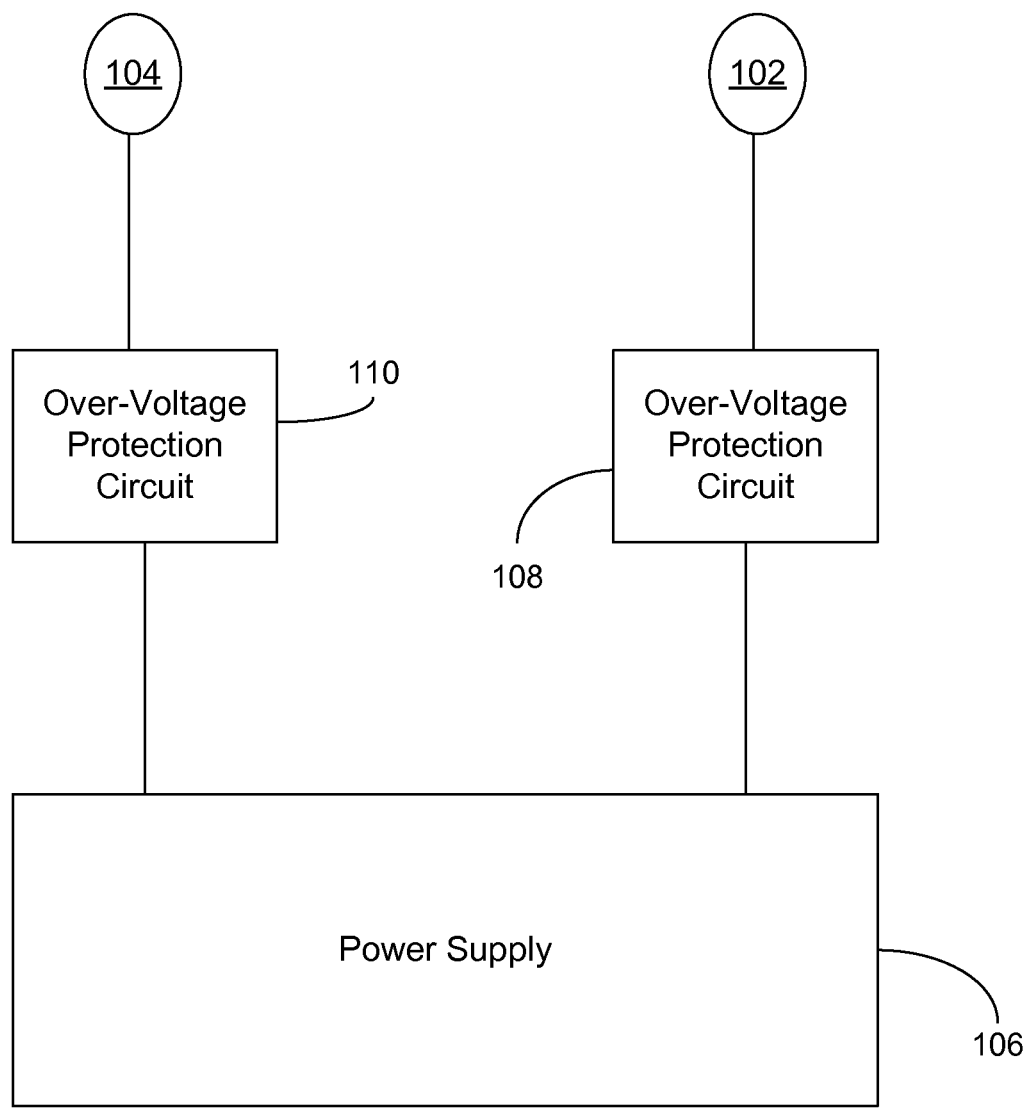
FIG. 1 illustrates a conventional charging device including a plurality of charging ports.
Figure 2:
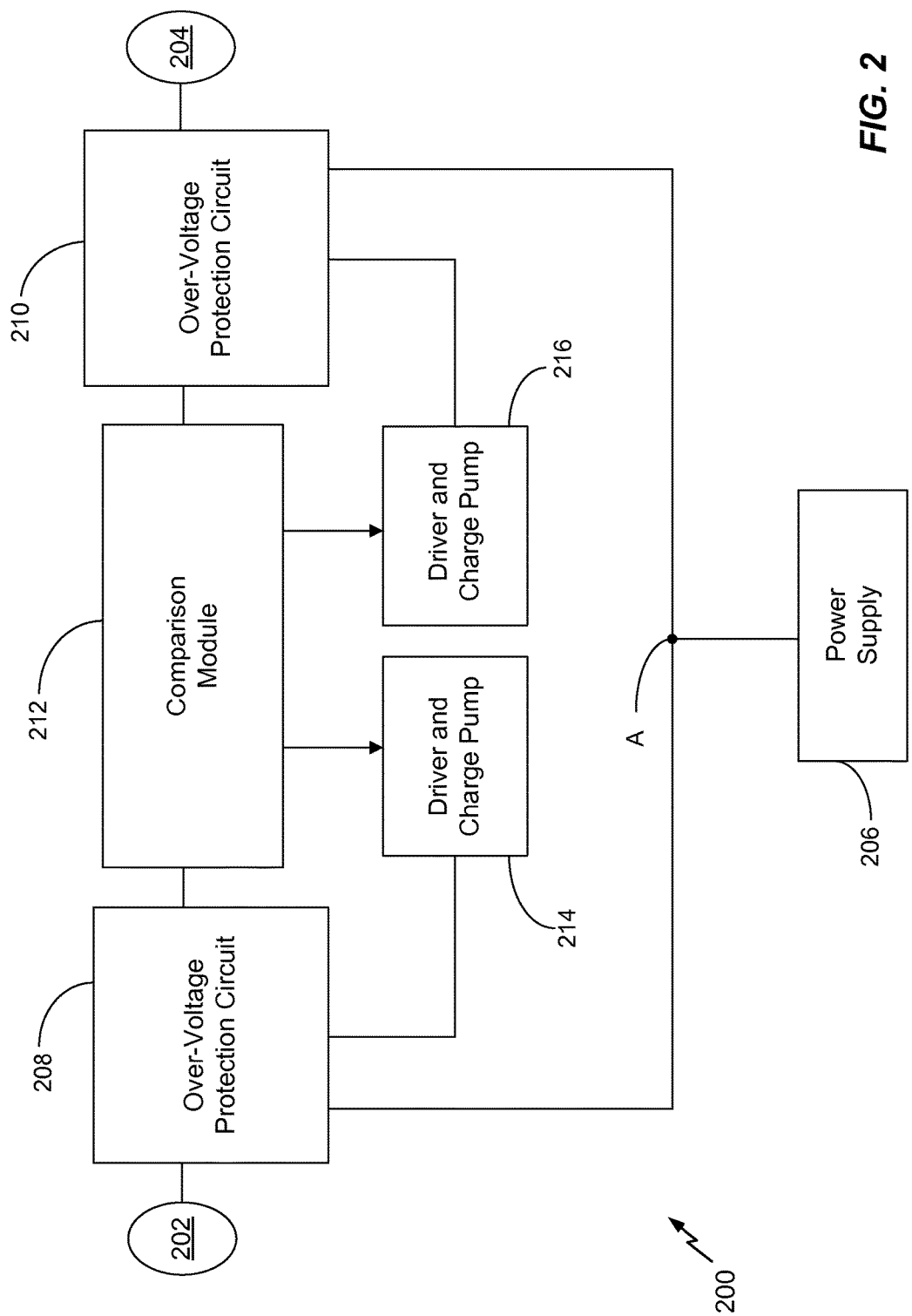
FIG. 2 illustrates a charging device, in accordance with an exemplary embodiment of the present invention.

FIG. 2 illustrates a charging device 200, according to an exemplary embodiment of the present invention. For example only, charging device 200 may comprise a charger of an electronic device, such as, for example only, a mobile telephone. Charging device 200 includes a first charging port 202 and a second charging port 204. According to one exemplary embodiment, first charging port 202 may comprise a USB charging port and second charging port 204 may include a DC charging port.

In addition, charging device 200 includes a switch mode power supply (SMPS) 206, a first protection circuit 208, a second protection circuit 210, and a comparison module 212. Comparison module 212 is coupled to each of first protection circuit 208 and second protection circuit 210. As will be appreciated by a person having ordinary skill, a switch mode power supply (e.g., SMPS 206) may comprise and electronic power supply unit that incorporates a switching regulator, which is an internal control circuit that switches power transistors (e.g., MOSFETs) rapidly on and off in order to stabilize the output voltage or current.

Charging device 200 further includes a first driver and charge pump 214 coupled to each of first protection circuit 208 and comparison module 212. Furthermore, charging device 200 includes a second driver and charge pump 216 coupled to each of second protection circuit 210 and comparison module 212. First driver and charge pump 214 may be configured to receive a signal from comparison module 212 and convey a control signal to protection circuit 208 to enable first charging port 202 to electrically couple to power supply 206. Similarly, second driver and charge pump 216 may be configured to receive a signal from comparison module 212 and convey a control signal to second protection circuit 208 to enable second charging port 204 to electrically couple to power supply 206.

A contemplated operation of charging device 200 will now be described. Initially, when either a USB or a DC power source (not shown in FIG. 2) is coupled to charging device 200, a valid charger detection process may be performed. More specifically, charging device 200 may determine if a voltage supplied by either the USB or DC power source is within valid range. If the voltage supplied by the power source is within a valid range, a driver and charge pump (i.e., either first driver and charge pump 214 or second driver and charge pump 216) may quickly supply a voltage to an associated over-voltage protection circuit (e.g., within 5 milliseconds). It is noted that a level of a voltage, which is conveyed to an over-voltage protection circuit, may automatically be adjusted by the driver and charge pump such that the voltage does not exceed a gate oxide breakdown voltage of a transistor of the over-voltage protection circuit. After the charge pump (e.g., a charge pump of either first driver and charge pump 214 or second driver and charge pump 216) is fully charged, an associated OVP circuit (e.g., either first over-voltage protection circuit 202 or second over-voltage protection circuit 204) is turned on and a node A may be charged. It is noted that a "turn on" time and a resistance of the over-voltage protection circuit may prevent a large inrush current from causing excessive ringing on a USB or DC power source and, furthermore, may prevent mistrigger problems associated with a valid charger detection process.

As will be understood by a person having ordinary skill in the art, if both charging ports (i.e., first charging port 202 and second charging port 204) are connected to power sources, comparison module 212 may rely on a programmable priority bit to determine which charging port should be used for charging.

In the event that a power source is switched (e.g., from a DC power source to a USB power source, or vice versa), comparison unit 212 may maintain electrical isolation between the coupled power source and power supply 206 until a voltage at node A is less than or equal a threshold voltage. As a more specific example, comparison unit 212 may maintain electrical isolation between the coupled power source and power supply 206 until a voltage at node A is less than or equal to the voltage at the charging port, which is coupled to the power source. As will be appreciated, isolating a power supply from the charging port may prevent back current from flowing from node A to the charging port. During this time, power supply 206 may continue to draw power from node A until the voltage at node A is discharged to a minimum voltage (e.g., 4.3V by default and programmable) and provides system current. Once the voltage at node A reaches the minimum, an input voltage regulation loop of power supply 206 may automatically reduce a duty cycle, and system current relies on stored voltage in a storage device (e.g., a capacitor) at node A.

Before a voltage at node A reaches a minimum voltage, comparison module 212 may "turn off" a protection circuit that was enabled prior to power path switching and quickly "turn on" another protection circuit. According to one exemplary embodiment, a protection circuit may be turned on within 150 microseconds. In this exemplary embodiment, a storage device (e.g., a capacitor) near or at node A is 100 uF, a switch over time can allow max one ampere system current without triggering an under voltage lockout (ULVO). In another example having a relatively small system current (e.g., less than one ampere), an over-voltage protection circuit may be turned on in 150 microseconds+a wait time (i.e., a time duration required for a voltage at node A to become less than or equal to a voltage at the USB power source). In another example having a relatively large system current (e.g., one or amperes), an over-voltage protection circuit may be turned on in a fixed time (e.g., 150 microseconds). It is noted that a switch over time (i.e., a power path switching time) may adjusted depending on a system current. It is further noted that as switching time increases, a size of a storage device near or at node A may be decreased.

Figure 3:
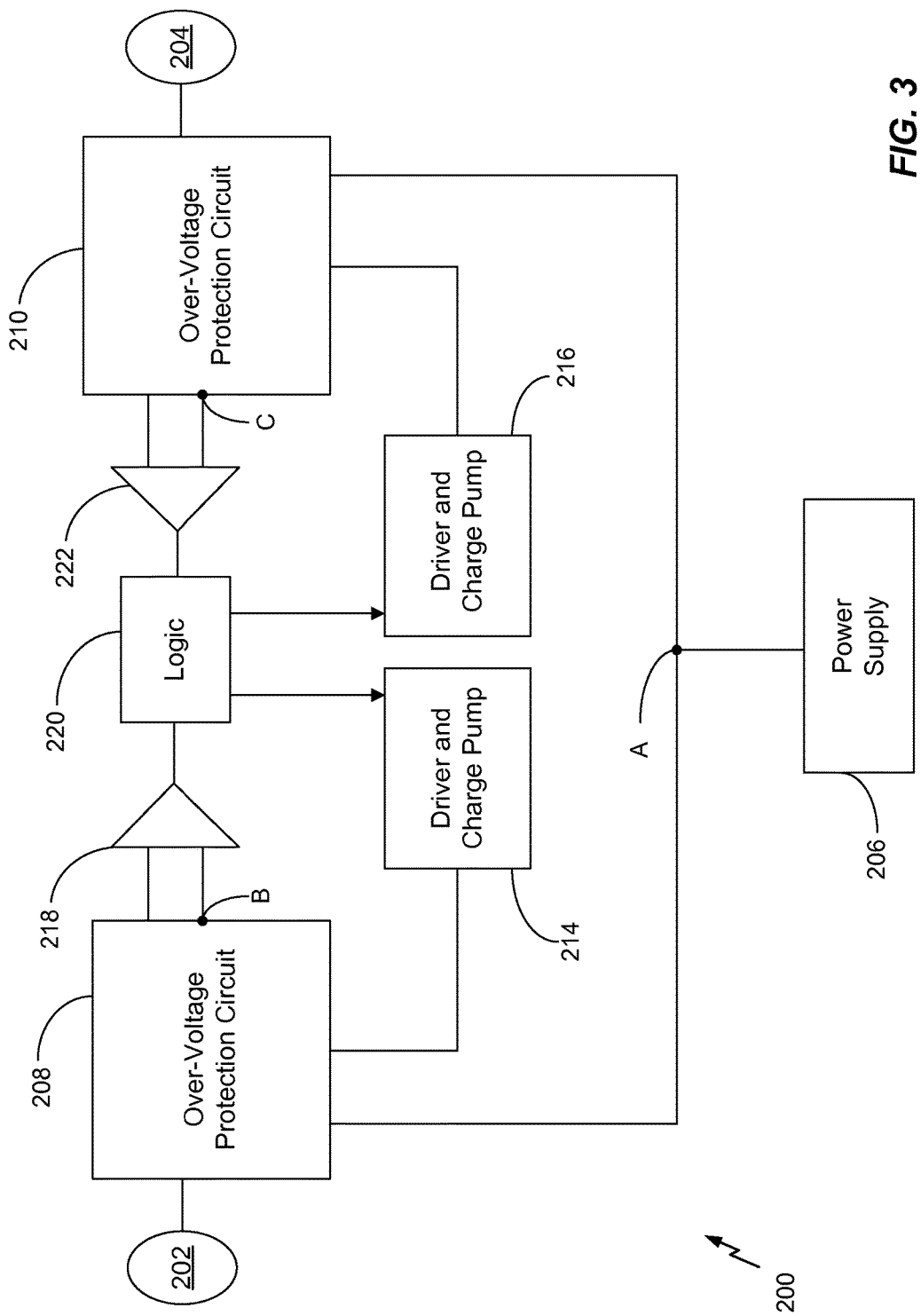
FIG. 3 is another illustration of a charging device, according to an exemplary embodiment of the present invention.

FIG. 3 is a more detailed illustration of charging device 200. As illustrated in FIG. 3, comparison module 212 may include a first comparator 218, logic device 220, and a second comparator 222. For example, one input (e.g., a non-inverting input) of first comparator 218 is coupled to first charging port 202 and another input (e.g., an inverting input) of first comparator 218 is coupled to a node B, which is further coupled to node A. Further, one input (e.g., a non-inverting input) of second comparator 222 is coupled to second charging port 204 and another input (e.g., an inverting input) of second comparator 222 is coupled to a node C, which is further coupled to node A.

Figure 4:
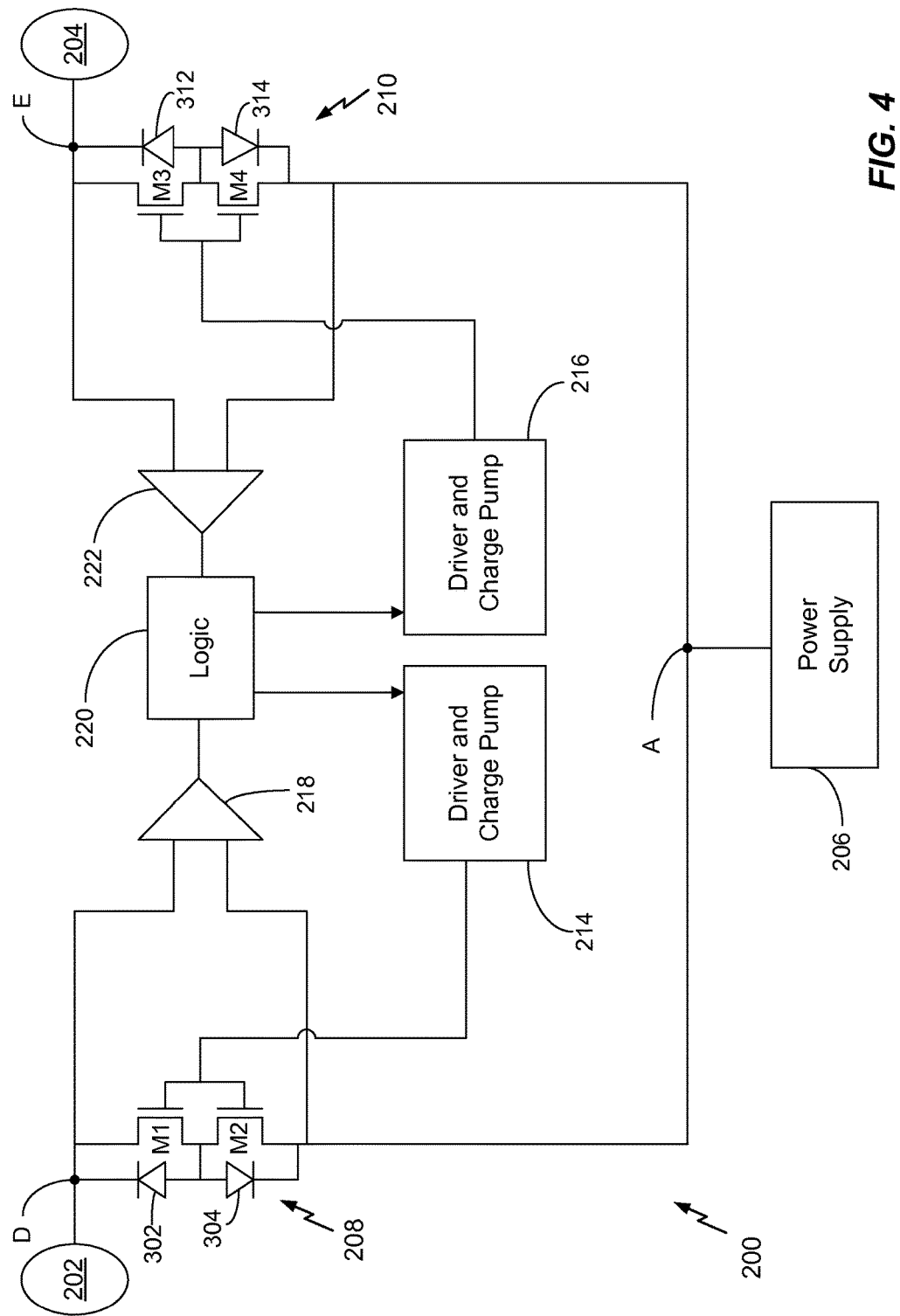
FIG. 4 is yet another illustration of a charging device, according to an exemplary embodiment of the present invention.

FIG. 4 provides an example configuration of first switching element 208 and second switching element 210. As illustrated, first switching element 208 includes a first diode 302, a second diode 304, a first transistor M1, and a second transistor M2. The sources of first transistor M1 and second transistor M2, which are coupled together, are coupled to the anodes of first diode 302 and second diode 304. Further, a cathode of first diode 302 is coupled to a drain of first transistor M1 and a cathode of second diode 304 is coupled to a drain of second transistor M2. Additionally, a gate of first transistor M1 and a gate of second transistor M2 are coupled to first driver and charge pump 214.

Second switching element 210 includes a first diode 312, a second diode 314, a first transistor M3, and a second transistor M4. The sources of first transistor M3 and second transistor M4, which are coupled together, are coupled to the anodes of first diode 312 and second diode 314. Further, a cathode of first diode 312 is coupled to a drain of first transistor M3 and a cathode of second diode 314 is coupled to a drain of second transistor M4. Additionally, a gate of first transistor M3 and a gate of second transistor M4 are coupled to second driver and charge pump 216.

A contemplated power path switching operation of charging device 200 will now be described in general. Thereafter, more specific examples of power path switching operations will be described. Upon a user of charging device 200 switching from a first charging source to a second charging source (e.g., decoupling a DC power source from charging port 204 and coupling a USB power source to charging port 202), a voltage supplied from the second charging source (i.e., a voltage at a node D) is compared to a voltage at node A. So long as a voltage at node A is greater than a threshold voltage (e.g., the voltage at node D), comparison module 212 maintains electrical isolation between the second charging source and node A. Upon the voltage at node A being adequately discharged (i.e., the voltage at node A drops below the threshold voltage), the second charging source may be coupled to node A via an associated over-voltage protection circuit.

More specifically, according to one exemplary embodiment, a user may switch from a DC power source (i.e., coupled to charging port 204) to a USB power source (i.e., coupled to charging port 202). In this example, the DC power source may supply a voltage of substantially 10 volts on a node E and the USB power source may supply a voltage of substantially 5 volts on node D. Therefore, prior to decoupling the DC power source from charging port 204, node A may have a voltage of substantially 10 volts. Upon decoupling a DC power source from charging port 204 and coupling a USB power source to charging port 202, a voltage at node A is compared to a voltage at node D. So long as a voltage at node A is above a threshold (e.g., so long as the voltage at node A is greater than the voltage at node D), charging port 202 is electrically isolated from node A. More specifically, so long as a voltage at node A is above a threshold, transistors M1 and M2 will remain in a non-conductive state and, thus, over-voltage protection circuit 208 may electrically isolate charging port 202 from node A. Upon a voltage at node A becoming equal to or less than the voltage at node D, over-voltage protection circuit 208 may cause transistors M1 and M2 to conduct and, therefore, charging port 202 may electrically couple to node A.

According to another exemplary embodiment, a user may switch from a USB power source (i.e., coupled to charging port 202) to a DC power source (i.e., coupled to charging port 204). In this example, the DC power source may supply a voltage of substantially 10 volts on node E and the USB power source may supply a voltage of substantially 5 volts on node D. Therefore, prior to decoupling the USB power source from charging port 202, node A may have a voltage of substantially 5 volts. Upon decoupling a USB power source from charging port 202 and coupling a DC power source to charging port 204), a voltage at node A is compared to a voltage at node E. In this example, because a voltage at node A is less than a voltage at node E, over-voltage protection circuit 216 may cause transistors M3 and M4 to conduct and, therefore, charging port 204 will electrically couple to node A.

Figure 5:
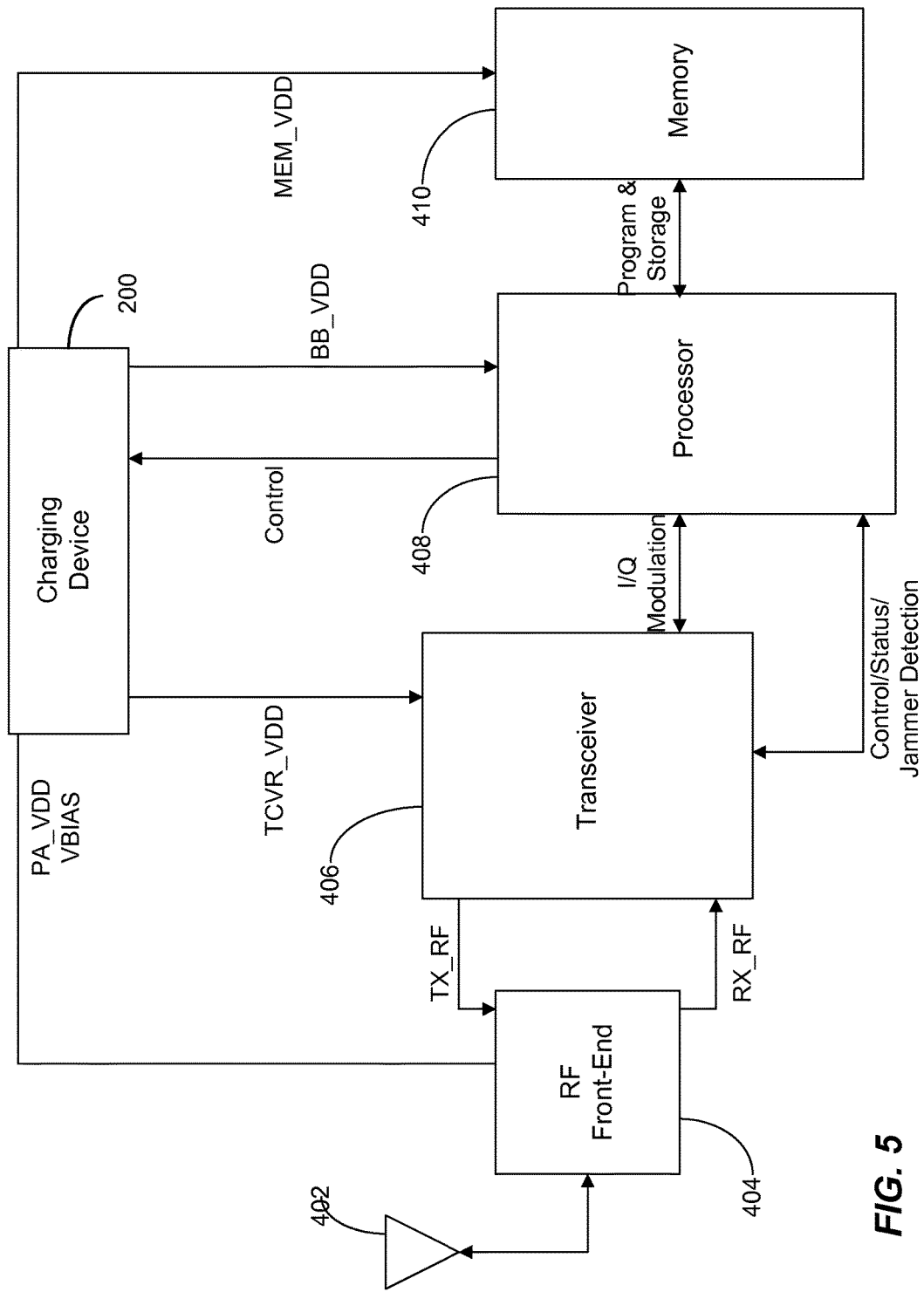
FIG. 5 is an electronic device including a charging device, in accordance with an exemplary embodiment of the present invention.

FIG. 5 illustrates an electronic device 400, in accordance with an exemplary embodiment of the present invention. Electronic device 400, which may comprise for example a mobile handheld device, includes radio frequency (RF) antenna 402 connected to RF Front-End 404. RF Front-End 404 separates transmit and receive RF signal paths, and provides amplification and signal distribution. RF signals for transmit, TX_RF, and receive, RX_RF, are passed between transceiver 406 and RF Front-End 404. Transceiver 406 is configured to down-convert a RX_RF signal from RF to a signal for baseband I/Q demodulation by processor 408, which may be a baseband modem or the like. Transceiver 406 is similarly configured to up-convert a signal from processor 408, using baseband I/Q modulation, to a TX_RF signal. Signals to be up-converted and down-converted from/to baseband I/Q modulation are shown connected between transceiver 406 and processor 408. Memory 410 stores processor programs and data and may be implemented as a single integrated circuit (IC), as shown. Processor 408 is configured to demodulate incoming baseband receive I/Q signals, encode and modulates baseband transmit I/Q signals, and run applications from storage, such as memory 410, to process data or send data and commands to enable various circuit blocks, all in a known manner. In addition, processor 408 generates control signals to transceiver 406 through a data bus, serial bus, or a dedicated set of signals. Such control signals may include, for example, turning transceiver 406 on and off, measuring received signal strength, setting transmit RF signal power or receive signal path gains, changing RF channels, detecting receiver signal jammers, and switching transmit/receive signal blocks between high power and power saving modes. Processor 408 is also configured to read the state of transceiver 406, and at the same time also receive one or more interrupt signals (not shown) from transceiver 4060. Interrupt signals are used to initiate commands and algorithms between transceiver 406 and processor 408. It should be appreciated that the general operation of processor 408, transceiver 406, and memory 410 are well known and understood by those skilled in the art, and that various ways of implementing the associated functions are also well known, including providing or combining functions across fewer integrated circuits (ICs), or even within a single IC.

Processor 408, transceiver 406, memory 410, and RF Front-End 404 of FIG. 5 typically require a power supply to operate. In accordance with an exemplary embodiment of the present invention, charging device 200, as described above, may supply power for various components of electronic device 400. More specifically, charging device 200 may be configured to supply voltages for powering each of processor 408 (BB_VDD), transceiver 406 (TCVR_VDD), memory 410 (MEM_VDD), and RF Front-End 404 (PA_VDD and VBIAS). Charging device 200 may also provide supply voltages to other blocks as necessary (not shown).

Figure 6:
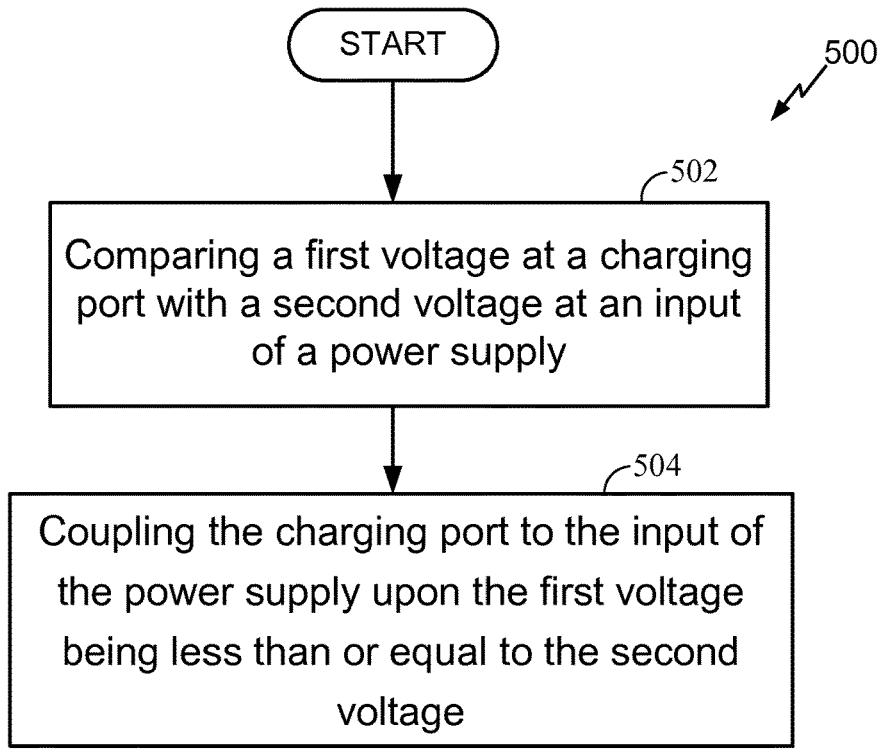
FIG. 6 is a flowchart illustrating a method, in accordance with an exemplary embodiment of the present invention.

FIG. 6 is a flowchart illustrating a method 500, in accordance with one or more exemplary embodiments. Method 500 may include comparing a first voltage at a charging port with a voltage at an input of a power supply (depicted by numeral 502). Method 500 may also include coupling the charging port to the input of the power supply upon the first voltage being less than or equal to the second voltage (depicted by numeral 504).

Figure 7:
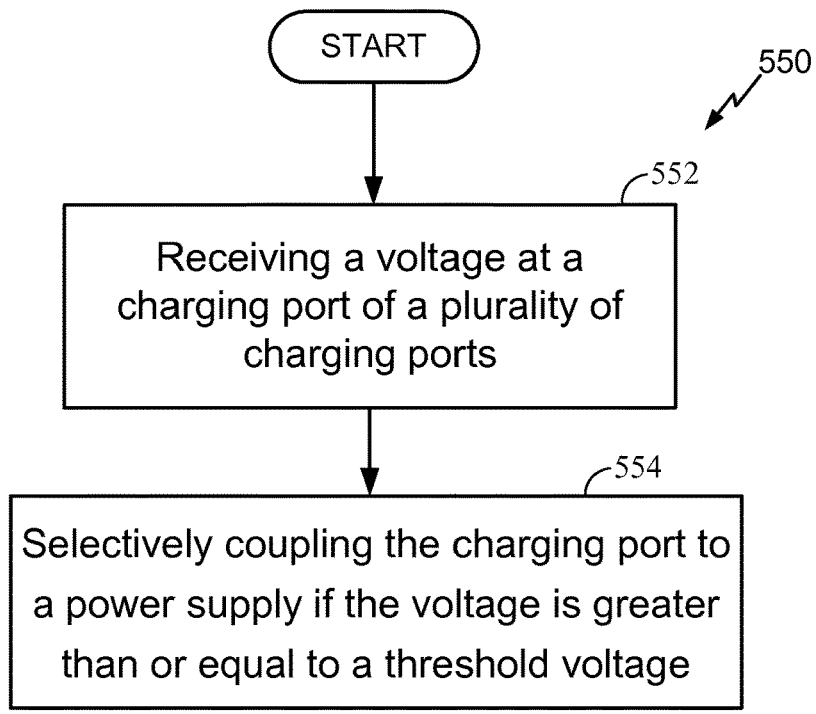
FIG. 7 is a flowchart illustrating another method, according to an exemplary embodiment of the present invention.

FIG. 7 is a flowchart illustrating another method 550, in accordance with one or more exemplary embodiments. Method 550 receiving a voltage at a charging port of a plurality of charging ports (depicted by numeral 552). Further, method 550 may include selectively coupling the charging port to a power supply if the voltage is greater than or equal to a threshold voltage (depicted by numeral 554).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device, comprising:
    a first charging port of a plurality of charging ports for coupling to a power supply via a first over-voltage protection circuit; and
    a comparison unit configured to couple the first charging port to the power supply based at least partially on a comparison between a voltage at an input of the first over-voltage protection circuit coupled to the first charging port and a voltage at an output of the first over-voltage protection circuit coupled to the power supply, the voltage at the output of the first over-voltage protection circuit generated by a voltage from a second charging port of the plurality of charging ports.

2. The device of claim 1, further comprising the second charging port of the plurality of charging ports coupled to the power supply via a second over-voltage protection circuit.

3. The device of claim 2, the comparison unit configured to couple the second charging port to the power supply based at least partially on a comparison between a voltage at an input of the second over-voltage protection circuit coupled to the second charging port and a voltage at the output of the second protection circuit coupled to the power supply.

4. The device of claim 1, the first charging port configured to couple to one of a Universal Serial Bus (USB) power source and a direct current (DC) power source.

5. The device of claim 1, the comparison unit comprising:
    a first comparator having a first input coupled to the input of the input of the first over-voltage protection circuit and a second input coupled to the output of the first over-voltage protection circuit;
    a second comparator having a first input coupled to an input of a second over-voltage protection circuit and a second input coupled to an output of the second over-voltage protection circuit; and
    a logic device configured to receive an output of the first comparator and an output of the second comparator, the logic device further configured to output at least one control signal for controlling a state of the first over-voltage protection circuit and a state of the second over-voltage protection circuit.

6. The device of claim 1, the comparison unit configured to couple the first charging port to the power supply when a voltage at the first charging port is less than or equal to a voltage at the input of the power supply.

7. A device, comprising:
    a first charging port coupled to an input of a first over-voltage protection circuit;
    a second charging port coupled to an input of a second over-voltage protection circuit; and
    a comparison unit configured to select one of the first charging port and the second charging port for charging, the comparison unit further configured to selectively couple the selected charging port to a power supply based at least partially on a comparison between a voltage at the selected charging port and a voltage at an input of the power supply, the voltage at the input of the power supply generated by a voltage from a non-selected one of the first and second charging ports.

8. The device of claim 7, the first charging port comprising a USB charging port and the second charging port comprising a DC charging port.

9. The device of claim 7, the comparison unit comprising:
a first comparator configured to receive a voltage from the first charging port and the voltage at the input of the power supply;
a second comparator configured to receive a voltage from the second charging port and the voltage at the input of the power supply; and
a logic device coupled to an output of the first comparator and an output of the second comparator.

10. The device of claim 7, the first over-voltage protection circuit comprising:
a first transistor coupled to the first charging port; and
a second transistor coupled to each of the first transistor and the input of the power supply.

11. The device of claim 10, each of the first transistor and the second transistor configured to receive a signal at a gate for coupling the first charging port to the power supply.

12. The device of claim 10, further comprising a driver and charge pump configured to convey a signal to a gate of the first transistor and a gate of the second transistor.

13. The device of claim 7, the second over-voltage protection circuit comprising:
a first transistor coupled to the second charging port; and
a second transistor coupled to each of the first transistor and the input of the power supply.

14. The device of claim 13, further comprising a driver and charge pump configured to convey a signal to a gate of the first transistor and a gate of the second transistor.

15. The device of claim 13, each of the first transistor and the second transistor configured to receive a signal at a gate for coupling the second charging port to the power supply.

16. The device of claim 7, the comparison unit configured to select one of the first charging port and the second charging port for charging based on a programmable priority bit.

17. A method, comprising:
comparing a first voltage at a first charging port of a plurality of charging ports and a second voltage at an input of a power supply; and
coupling the first charging port to the input of the power supply upon the first voltage being less than or equal to the second voltage, the voltage at the input of the power supply generated by a voltage from a second charging port of the plurality of charging ports.

18. The method of claim 17, further comprising:
comparing a third voltage at the second charging port with the second voltage; and
coupling the second charging port to the input of the power supply upon the third voltage being less than or equal to the second voltage.

19. The method of claim 17, further comprising detecting a power source coupled to the first charging port.

20. A method, comprising:
receiving a voltage at a first charging port of a plurality of charging ports; and
selectively coupling the first charging port to a power supply based at least partially on a comparison between a voltage at the selected charging port and a voltage at an input of the power supply, the voltage at the input of the power supply generated by a voltage from a second charging port of the plurality of charging ports.

21. The method of claim 20, further comprising receiving a second voltage at the second charging port of the plurality of charging ports.

22. The method of claim 21, further comprising selectively coupling the second charging port to the power supply if the second voltage is greater than or equal to a threshold voltage.

23. The method of claim 20, further comprising selecting either the first charging port or the second charging port for coupling to the power supply based on priority between the first charging port and the second charging port.

24. A device, comprising:
means for comparing a first voltage at a first charging port of a plurality of charging ports and a second voltage at an input of a power supply; and
means for coupling the first charging port to the input of the power supply upon the first voltage being less than or equal to the second voltage, the voltage at the input of the power supply generated by a voltage from a second charging port of the plurality of charging ports.

25. The device of claim 24, further comprising:
means for comparing a third voltage at the second charging port with the second voltage; and
means for coupling the second charging port to the input of the power supply upon the third voltage being less than or equal to the second voltage.

* * * * *